(12) United States Patent
Zhang

(10) Patent No.: US 7,206,518 B2
(45) Date of Patent: Apr. 17, 2007

(54) HIGH SPEED OPTOELECTRONIC SUBASSEMBLY AND PACKAGE FOR OPTICAL DEVICES

(75) Inventor: Yong Shan Zhang, San Jose, CA (US)

(73) Assignee: Bookham Technology, PLC, Northamptonshire (GB)

( * ) Notice: Subject to any disclaimer, the term of this patent is extended or adjusted under 35 U.S.C. 154(b) by 650 days.

(21) Appl. No.: 10/701,774

(22) Filed: Nov. 5, 2003

(65) Prior Publication Data

US 2005/0259706 A1 Nov. 24, 2005

Related U.S. Application Data

(60) Provisional application No. 60/427,681, filed on Nov. 19, 2002.

(51) Int. Cl.
*H04B 10/04* (2006.01)
(52) U.S. Cl. .................. 398/182; 372/43.01; 398/164; 398/201; 385/14; 385/92; 385/93; 257/79; 257/734
(58) Field of Classification Search .............. 257/84, 257/99–100, 664–712, 79, 734; 372/43, 372/43.01; 385/35–77, 89–93; 398/182, 398/164, 201
See application file for complete search history.

(56) References Cited

U.S. PATENT DOCUMENTS

| | | | | |
|---|---|---|---|---|
| 4,733,932 A | * | 3/1988 | Frenkel et al. | 385/92 |
| 4,989,930 A | * | 2/1991 | Nakagawa et al. | 385/35 |
| 2002/0012369 A1 | * | 1/2002 | Nasu et al. | 372/36 |
| 2002/0142626 A1 | * | 10/2002 | Smeltz, Jr. | 439/65 |

* cited by examiner

*Primary Examiner*—Kenneth Vanderpuye
*Assistant Examiner*—Li Liu
(74) *Attorney, Agent, or Firm*—Parsons & Goltry; Robert A. Parsons; Michael W. Goltry

(57) ABSTRACT

A high speed optoelectronic subassembly in an optoelectronic package is disclosed that includes a dielectric support having a first electrical trace on a surface thereof and a dielectric member mounted on the surface of the support having a second electrical trace thereon. The support extends laterally a distance greater than the member to form a shelf. A dielectric step is positioned on the shelf abutting an end of the member and a laser is positioned on the shelf adjacent the step so as to be light accessible external to the subassembly. The laser and the step have surfaces equal in height and cooperate to provide a mounting platform. A resistive element is positioned on the mounting platform and electrically connected to the laser, the resistive element and laser being electrically externally accessible through the traces.

16 Claims, 5 Drawing Sheets

HIGH SPEED OPTOELECTRONIC SUBASSEMBLY AND PACKAGE FOR OPTICAL DEVICES

CROSS-REFERENCE TO RELATED APPLICATIONS

This application claims the benefit of U.S. Provisional Application No. 60/427,681, filed 19 Nov. 2002.

FIELD OF THE INVENTION

This invention relates to optoelectronic packages and, more particularly, to an optoelectronic package with improved electrical interconnections for high speed operation.

BACKGROUND OF THE INVENTION

In optical-to-electrical and electrical-to-optical (hereinafter "optoelectronic") modules used in the various communications fields, one of the most difficult problems that must be solved is the electrical interconnection of the various components and the shielding of the module to prevent radiation, (e.g., electromagnetic interference (EMI)) into or out of the module. Providing this efficient interconnection and shielding requires very precise assembly procedures. Here it will be understood by those skilled in the art that the term "light", as used throughout this disclosure, is a generic term which includes any electromagnetic radiation that can be modulated and transmitted by optical fibers or other optical transmission lines.

Much of the optoelectronic module fabrication difficulty and expense is due to mounting and shielding difficulties of optical components, such as lasers, light emitting diodes, photodiodes, etc. Generally, there are two types of lasers that are used in optoelectronic modules, edge emitting lasers and surface emitting lasers. Edge emitting lasers emit light in a path parallel to the mounting surface while surface emitting lasers emit light perpendicular to the mounting surface. The light from either of the lasers must then be directed into an optical fiber for transmission to a remotely located light receiver (i.e., a photodiode or the like).

Lens systems are used at both ends of the optical fiber to direct light from a light-generating component into the optical fiber and to direct light from the optical fiber onto a light-sensing component. The apparatus used to mount the optical components and the lens systems can have a substantial effect (i.e. cost, complexity, operating life and characteristics, etc.) on the construction of the optical systems and the assembly procedures for the optical systems. Also, the mounting structure for the optical components and the lens system must be very rugged and stable so that alignment is not disturbed by use or temperature changes. Further, the entire module must be shielded from external signals and the like to prevent radiation to other external devices or modules.

Optoelectronic packaging solutions for light emitting devices are designed to allow efficient coupling of the light emitting device with an optical system. The light emitting device is driven by control circuitry which may or may not be housed in the optoelectronic package with the light emitting device. However, a compact package which a high optical coupling efficiency is still desirable. The package must also provide adequate thermal dissipation of the heat generated by light emitting devices. It is also highly desirable to provide impedance matching and a higher bandwidth.

Traditional optoelectronic packaging solutions include using a TO can package or other similar packaging technologies. The prior art packages also generally include interconnections of components by wire leads, pigtails, etc. However, these packages are too expensive and/or have performance issues, i.e., wire connections require high labor intensity and substantially high length leads. They also tend to introduce a significantly high inductance into the connections and laser control circuitry that substantially reduces the operating speed.

It would be highly advantageous, therefore, to remedy the foregoing and other deficiencies inherent in the prior art.

Accordingly, it is an object the present invention to provide a new and improved high speed optoelectronic subassembly and optoelectronic package.

Another object of the present invention is to provide a new and improved high speed high speed optoelectronic subassembly and optoelectronic package with integrated connections that reduce the length and inductance.

Another object of the present invention is to provide a new and improved high speed high speed optoelectronic subassembly and optoelectronic package that is rugged and stable.

Another object of the present invention is to provide a new and improved high speed high speed optoelectronic subassembly and optoelectronic package that improves the fabrication efficiency and manufacturing capabilities of optoelectronic modules.

Still another object of the present invention is to provide a new and improved high speed high speed optoelectronic subassembly and optoelectronic package that allows the use of a variety of optical components and component materials.

Still another object of the present invention is to provide a new and improved high speed high speed optoelectronic subassembly and optoelectronic package that is designed to reduce outside interference with the desired signal without the need for a TO can.

SUMMARY OF THE INVENTION

Briefly, to achieve the desired objects of the instant invention in accordance with a preferred embodiment thereof, a high speed optoelectronic subassembly in an optoelectronic package is disclosed that includes a dielectric support having a first electrical trace on a surface thereof and a dielectric member mounted on the surface of the support having a second electrical trace thereon. The support extends laterally a distance greater than the member to form a shelf. A dielectric step is positioned on the shelf abutting an end of the member and an optoelectronic component, such as a laser or photodiode, is positioned on the shelf adjacent the step so as to be light accessible external to the subassembly. The optoelectronic component and the step have surfaces equal in height and cooperate to provide a mounting platform. An inactive electronic component, such as a resistive element, is positioned on the mounting platform and electrically connected to the optoelectronic component, the inactive electronic component and optoelectronic component being electrically externally accessible through the traces.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

It will be understood by those skilled in the art that modules of the type discussed herein generally include a pair of channels, one of which receives electrical signals, converts the electrical signals to optical (light) beams by way of a laser or the like and introduces them into one end of an optical fiber, which then transmits the modulated optical beams to external apparatus.

The second channel of the module receives modulated optical beams from an optical fiber connected to the external apparatus, conveys the modulated optical beams to a photo diode or the like, which converts them to electrical signals. In the following description, the apparatus and methods can generally be used in either of the channels but, since the optical portions of the two channels are substantially similar, only one channel will be discussed with the understanding that the description applies equally to both channels.

Figure 1:
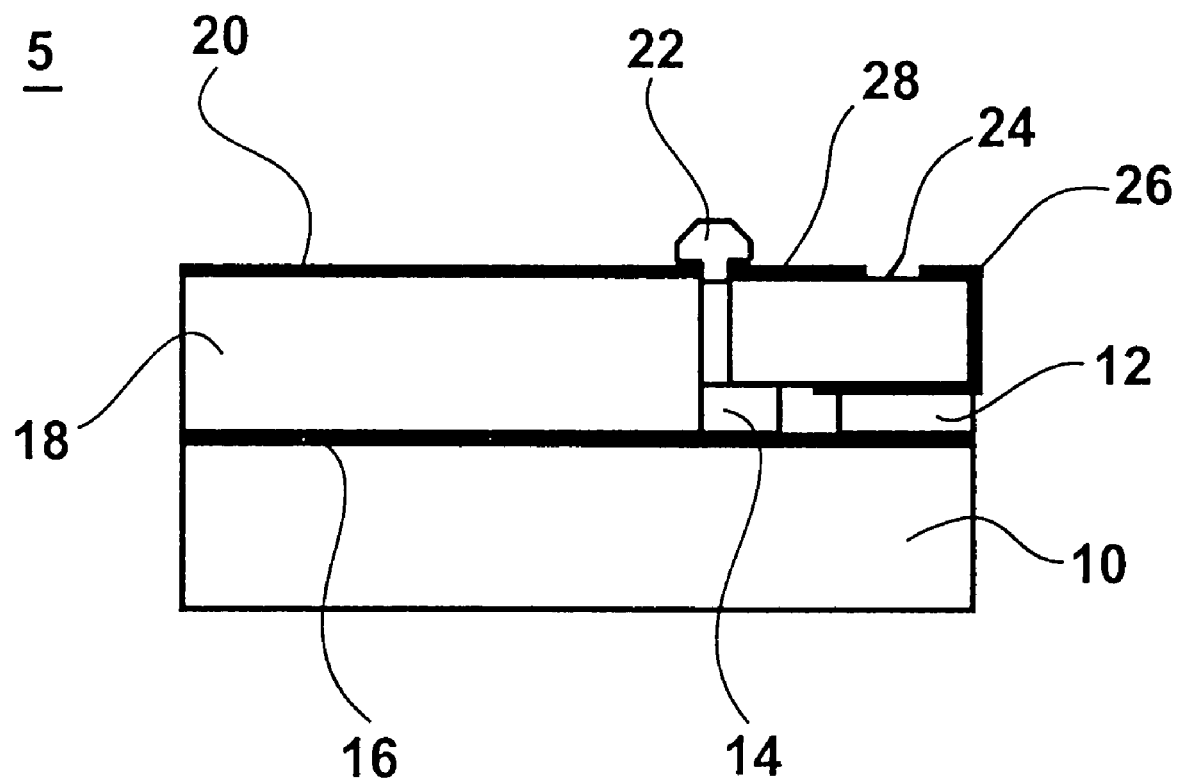
FIG. 1 is a side view of an optoelectronic subassembly in accordance with the present invention.

Turn now to FIG. 1 which illustrates a side view of an optoelectronic subassembly 5 in accordance with the present invention. In this example, for purposes of explanation, subassembly 5 is used to mount a laser but it will be understood that other optoelectronic components may be included in addition to or instead of the laser. Optoelectronic subassembly 5 has a dielectric support 10, including a ceramic or similar material with suitable electrical and thermal properties. A current return, ground, or power trace or plane 16 is positioned on dielectric support 10. Further, a dielectric member 18 is positioned on current return plane 16. Dielectric support 10 extends laterally a distance greater than dielectric member 18 to form a shelf on the surface, adjacent the end, of dielectric support 10. It will be understood that dielectric member 18 can include a ceramic or similar material region with suitable electrical and thermal properties. For example, support 10, return plane 16, and member 18 can be conveniently formed using laminated ceramic layers, with each of the support 10 and member 18 including one or more laminates.

In the preferred embodiment, a dielectric material step 14 is positioned on current return line 16 on the shelf and proximate to dielectric material member 18, as will be discussed presently. A light emitting device 12 is positioned on current return line 16 on the shelf and positioned proximate to dielectric material step 14. Further, light emitting device 12 is positioned on the shelf so as to be light accessible (i.e. either allowing generated light to exit the subassembly or allow external light to impinge upon the optoelectronic component in the subassembly) external to the subassembly. Generally, optoelectronic devices, such as device 12 have two electric terminals, one of which will be electrically connected to return line 16 by the mounting process. It will be understood that current return line 16 can include or be a part of a transmission line, conductive interconnect, or the like. Further, dielectric material step 14 can include a ceramic or similar material region with suitable electrical and thermal properties, e.g. formed as a part of dielectric material member 18. It will be understood that light emitting device 12 can be, for example, a laser diode or the like.

A conductive line 20 is positioned on the upper surface of dielectric material member 18. Conductive line 20 is included to provide a second electrical connection to light emitting device 12 and control circuitry (not shown). It will be understood that conductive line 20 can include or be part of a transmission line or a conductive interconnect and can, for example, form a transmission line in conjunction with current return line 16.

A resistor or resistive element 24 is positioned on the upper surface of light emitting device 12 and step 14 as illustrated. The height of step 14 is approximately equal to the height of light emitting device 12, to provide a flat mounting surface for resistive element 24, and the total height of step 14 and resistive element 24 is approximately equal to the height of dielectric material member 18 and conductive line 20. Resistive element 24 includes a conductive surface 26, positioned in contact with the second terminal of light emitting device 12, and a conductive surface 28, forming the first and second terminals, respectively, of resistive element 24.

Resistive element 24 is capable of substantially limiting the current flow through light emitting device 12 and is also capable of providing impedance matching between light emitting device 12 and control circuitry (not shown) coupled thereto. An electrical interconnect 22 electrically connects conductive line 20 to conductive surface 28. It will be understood that electrical interconnect 22 can include any of a variety of electrical conductive materials including, for example, solder, conductive paste, a ribbon bond, multibond wires, or the like. In this embodiment, electrical interconnect 22 includes a conductive paste. The use of a conductive paste results in a very low serial inductance and, therefore, very good impedance matching over a wider frequency range.

Further, in the preferred embodiment, step 14 is included and specifically designed to provide mechanical balance for resistor 24 and to prevent a short circuit, during assembly or otherwise, between electrical interconnect 22 and other electrical components within optoelectronic assembly 5, e.g. current return line 16 or surface 26 of resistive element 24.

Figure 2:
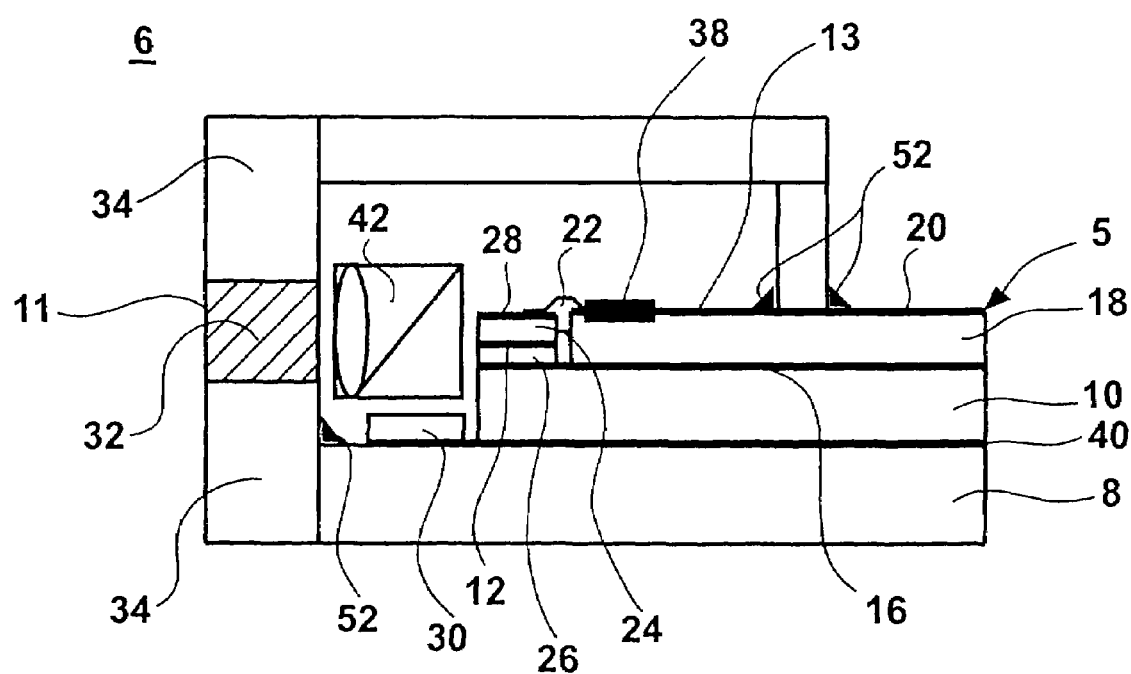
FIG. 2 is a sectional side view of an optoelectronic package, including the optoelectronic subassembly of FIG. 1, in accordance with the present invention.

Turn now to FIG. 2 which illustrates a plan view of an optoelectronic package 6 which includes optoelectronic subassembly 5 of FIG. 1. In this embodiment, optoelectronic subassembly 5 is supported on a substrate 8 which includes a stiff support, such as ceramic material or the like. Further, optoelectronic package 6 includes an enclosure 34 that provides hermetic sealing for optoelectronic subassembly 5. Enclosure 34 can include, for example, ceramic elements formed to enclose the optoelectronic elements, a TO can, or the like. Hermetic sealing is provided by using an epoxy 52 or similar material to fixedly attach enclosure 34 to substrate 8, conductive line 20, and/or dielectric material member 18. In this embodiment, enclosure 34 includes a side 11, formed to completely encircle the optoelectronic portions of the package, and a top 13. It will be understood that while enclosure 34 is illustrated as including several components it can be formed of a single piece, if desired. Also, it will be understood that hermetic sealing and enclosure 34 are optional in some applications, but is included in this embodiment for illustrative purposes.

In this embodiment, enclosure 34 includes a window 32 formed in or as a portion of side 11 which allows light emitted from light emitting device 12 to be transmitted through enclosure 34. A lens assembly 42 is included in enclosure 34 and positioned proximate to light emitting device 12 to provide optical focusing between an optical fiber (not shown) and the optoelectronic device in enclosure 34. Specific mounting structure for lens assembly 42 is not illustrated since that will depend upon the specific lens system utilized. For example, the illustrated two-way lens assembly 42 could include mounting ears, pedestals, or the like. It will be understood that lens assembly 42 is optional or could be positioned outside enclosure 34 in some specific applications. In this embodiment, a power monitoring diode 30 is positioned generally below lens assembly 42 and in a secondary light path from lens assembly 42. Included within lens assembly 42 is a surface 42A formed to reflect a small portion (e.g. 10% or less) of the light generated by light emitting device 12 onto diode 30 while passing most of the generated light through window 32. The small portion of generated light directed from light emitting device 12 to diode 30 is used to measure or monitor the optical output power of light emitting device 12.

Figure 3:
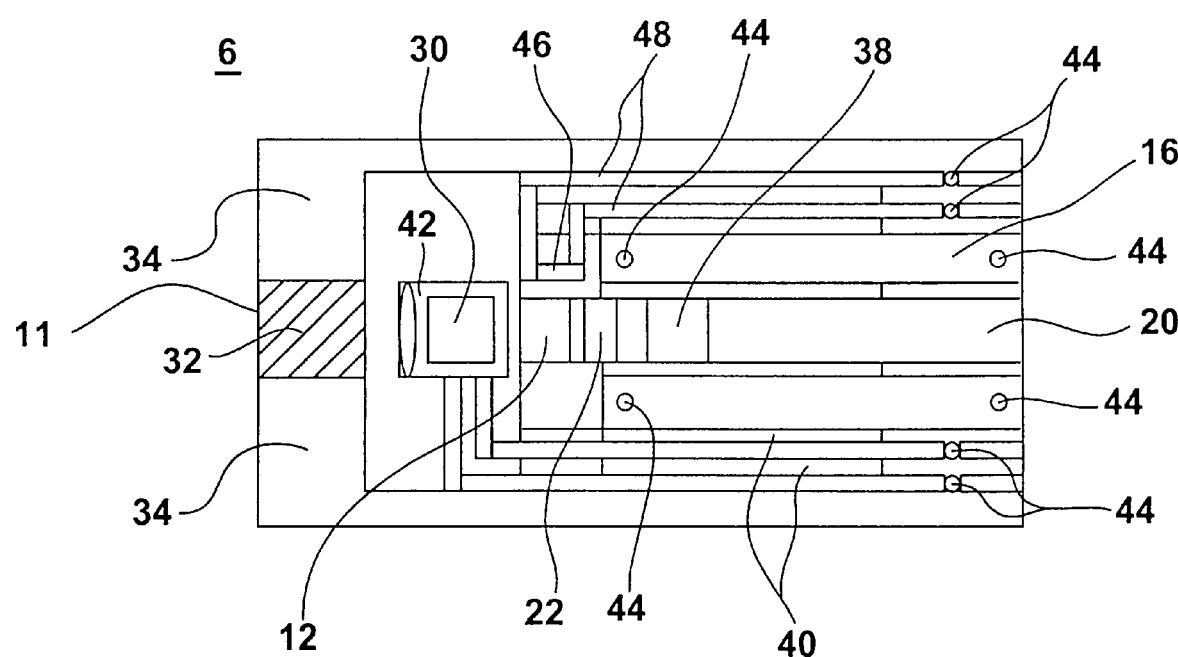
FIG. 3 is a top plan view of the optoelectronic package illustrated in FIG. 2, with an upper portion of the enclosure removed.

Turn now to FIG. 3 which illustrates a top plan view of optoelectronic package 6, with an upper portion of enclosure 34 removed. As shown, power monitoring diode 30 is electrically connected to control circuitry (not shown) through output traces 40. A thermistor 46 is positioned proximate to light emitting device 12 to provide a temperature sensing capability. Thermistor 46 is electrically connected to control circuitry (not shown) through conductive traces 48. It will be understood, however, that thermistor 46 is an optional component, but is included in the preferred embodiment for illustrative purposes. It will be understood that various traces and conductive surfaces can be electrically interconnected using conductive vias 44 as is well known by those skilled in the art. Further, an optional thin film resistor 38 can be included to provide RF tuning of light emitting device 12.

Figure 4:
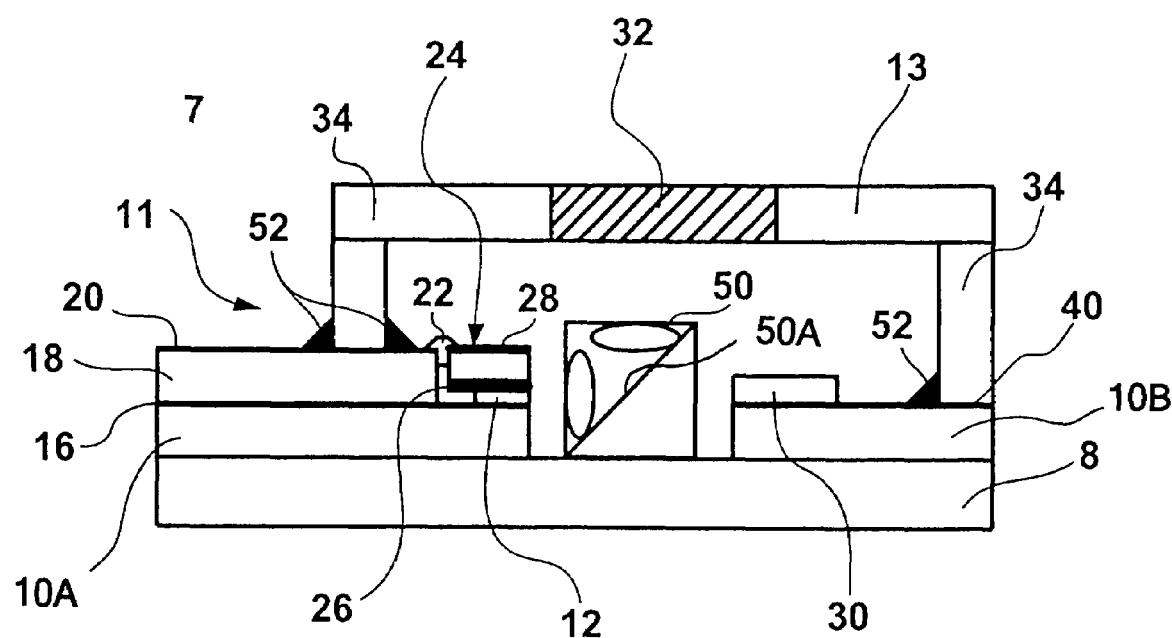
FIG. 4 is a sectional side view of another embodiment of an optoelectronic package in accordance with the present invention.

Turn now to FIG. 4 which illustrates another embodiment of an optoelectronic package 7, which includes optoelectronic subassembly 5, in accordance with the present invention. In this embodiment, optoelectronic subassembly 5 is supported on a substrate 8 which includes a stiff support, such as ceramic material or the like. A second portion of material 10B, having a height approximately the same as the height of dielectric support 10A and including a ceramic or similar material with similar electrical and thermal properties, is positioned in spaced relation to dielectric support 10A so as to leave a substantially centrally located cavity. Here it will be understood that both portions of material 10A and 10B could be formed as a single unit with a cavity in the mid part. A power monitoring trace or traces 40 are positioned on the upper surface of portion of material 10B and a power monitoring diode 30 is mounted on the upper surface of portion of material 10B in electrical contact with power monitoring traces 40.

In optoelectronic package 7, an enclosure 34 is formed with sides 11 and top 13, generally as described above and supported on the upper surface of dielectric material member 18 of subassembly 5 and portion of material 10B. A window 32 is formed in or as a portion of top 13 of enclosure 34 so as to be positioned generally above or in overlying relationship to the cavity formed by dielectric support 10A and the second portion of material 10B. A lens assembly 50, formed of plastic, glass, etc., is mounted on the upper surface of substrate 8 exposed by the cavity.

Lens assembly 50 is included to direct light through window 32 at an angle (i.e. 90° in this example) relative to light emitting device 12 and to provide optical focusing between an optical fiber (not shown) and the optoelectronic device in enclosure 34. Lens assembly 50 can include one or more lens of any desired type to focus the light, if desired. Also included within lens assembly 50 is a surface 50A formed to pass a small portion (e.g. 10% or less) of the light generated by light emitting device 12 onto diode 30 while reflecting most of the generated light at 90° through window 32. The small portion of generated light directed from light emitting device 12 to diode 30 is used to measure or monitor the optical output power of light emitting device 12.

Hermetic sealing can be provided by using sealant 52 to fixedly attach enclosure 34 to upper surfaces of dielectric material member 18 and the second portion of material 10B, generally over conductive line 20, power monitoring traces 40 as illustrated. Generally, sealant 32 can be any of the well known sealants, including solder, epoxy, etc.

Figure 5:
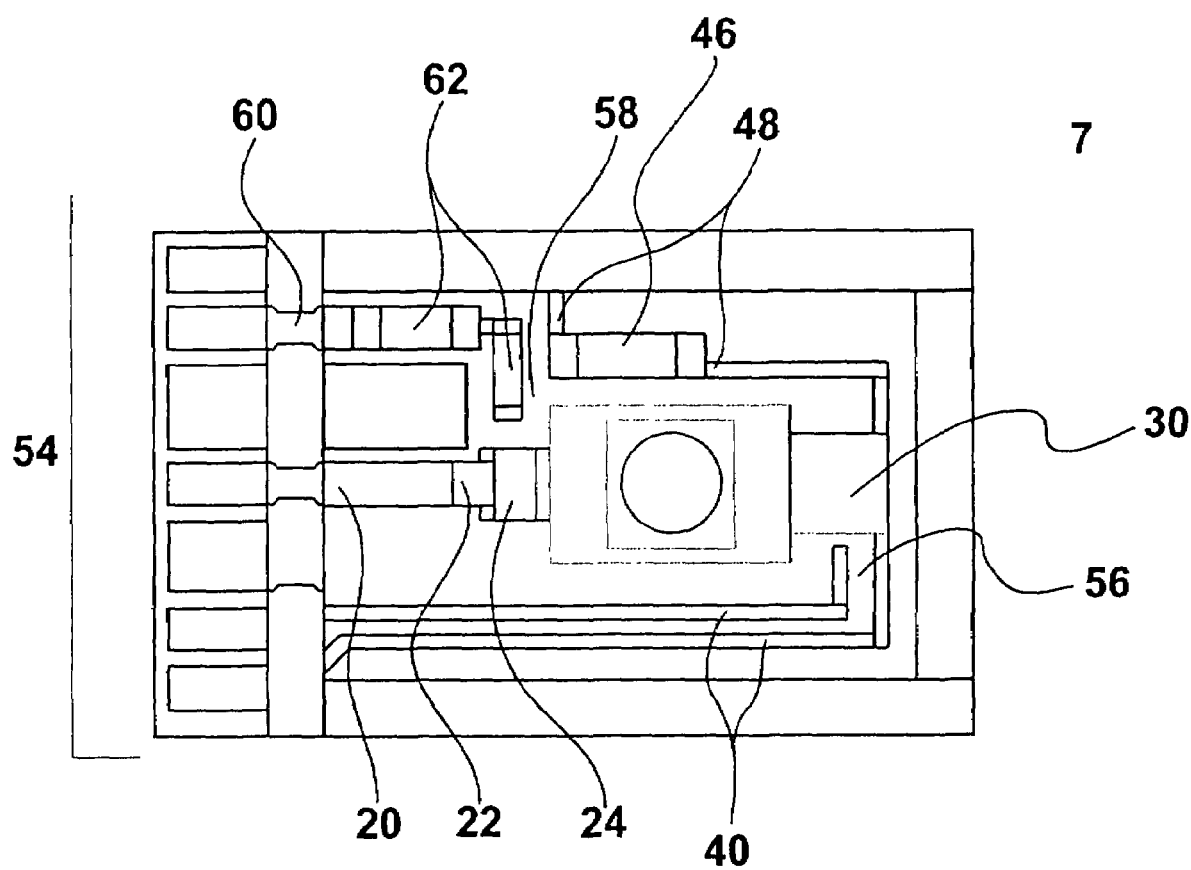
FIG. 5 is a top plan view of the optoelectronic package illustrated in FIG. 4, with an upper portion of the enclosure removed.

Turn now to FIG. 5 which illustrates a top plan view of optoelectronic package 7. In this embodiment, a flex stripline 54 interfaced to the micro stripline (formed by the traces in package 7) is electrically connected, external to package 7, to light emitting device 12 and power monitoring traces 40. However, it will be understood that other connectors could be interfaced to electrically communicate with light emitting device 12 and other optical and/or electrical components included within optoelectronic subassembly 5. The electrical connections (i.e. wire bonds or other electrical connection 60) from flex strip line 54 to the various traces can have a varying thickness to take into account the effect of enclosure 34 positioned on the electrical interconnections.

In this embodiment, an inductor 62 for RF chocking is bonded to resistive element 24 through a wire bond 58. It will be understood that inductor 62 is optional, but is included in this embodiment for illustrative purposes. Further, at least one of traces 40 can be electrically connected to an electrical terminal of power monitoring diode 30 through a wire bond 56, with the other terminal being connected to the other trace 40 during mounting. It will be understood, however, that inductor 62 and power monitoring diode 30 can be electrically connected to trace resistor 24 and trace 40, respectively, through other electrical connections, such as a conductive bridge or the like.

Thus, a new and improved high speed optoelectronic subassembly and optoelectronic package has been disclosed. Several embodiments of the high speed optoelectronic subassembly positioned in packages have been disclosed wherein the assembly allows high speed electrical communication between the optoelectronic component and outside control circuitry. The new and improved high speed optoelectronic subassembly and optoelectronic package with integrated connections reduces the length and inductance of electrical connections and is rugged and stable. Also, the new and improved high speed optoelectronic subassembly and optoelectronic package improves the fabrication efficiency and manufacturing capabilities of optoelectronic modules and allows the use of a variety of optical components and component materials. Further, while the new and improved high speed optoelectronic package is designed to reduce outside interference with the desired signal without the need for a TO can, a TO can may be used in some specific applications.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. High speed optoelectronic subassembly in an optoelectronic package comprising:
   a dielectric support having a first electrical trace on a surface thereof;
   a dielectric member having a first surface mounted on the surface of the dielectric support, a second opposed surface of the dielectric member having a second electrical trace thereon, the dielectric support extending laterally a distance greater than the dielectric member to form a shelf on the surface of the dielectric support;
   a dielectric step positioned on the shelf abutting an end of the dielectric member;
   an optoelectronic component having first and second electrical terminals positioned on the shelf adjacent the dielectric step so as to be light accessible external to the subassembly, the first terminal of the optoelectronic component being electrically connected to the first electrical trace, surfaces of the optoelectronic component and the dielectric step having a substantially similar height and cooperating to provide a mounting platform;
   an inactive electronic component having first and second electrical terminals and positioned on the mounting platform with the first electrical terminal of the electronic component electrically connected to the second terminal of the optoelectronic component and the second terminal of the electronic component electrically connected to the second electrical trace on the dielectric member; and
   the dielectric support mounted on a substrate with the first and second electrical traces externally accessible.

2. High speed optoelectronic subassembly in an optoelectronic package as claimed in claim 1 wherein the dielectric support and the dielectric member include ceramic.

3. High speed optoelectronic subassembly in an optoelectronic package as claimed in claim 1 wherein the optoelectronic component is a semiconductor laser.

4. High speed optoelectronic subassembly in an optoelectronic package as claimed in claim 1 wherein the first and second electrical traces cooperate to form a transmission line.

5. High speed optoelectronic subassembly in an optoelectronic package as claimed in claim 1 wherein the second terminal of the electronic component is electrically connected to the second electrical trace on the dielectric member by one of conductive paste, solder, multi-bond wires, and ribbon bond.

6. High speed optoelectronic subassembly in an optoelectronic package as claimed in claim 5 wherein the second terminal of the electronic component is electrically connected to the second electrical trace on the dielectric member by conductive paste.

7. High speed optoelectronic subassembly in an optoelectronic package as claimed in claim 1 further including a lens assembly positioned in light communication with the optoelectronic component.

8. High speed optoelectronic subassembly in an optoelectronic package as claimed in claim 7 further including an enclosure sealingly positioned over at least the optoelectronic component and including a window optically aligned with the optoelectronic component for passage of light through the window.

9. High speed optoelectronic subassembly in an optoelectronic package as claimed in claim 8 further including a power monitoring diode mounted within the enclosure.

10. High speed optoelectronic subassembly in an optoelectronic package as claimed in claim 9 wherein the optoelectronic component is a laser, the inactive electronic component is a resistive element, and the lens assembly is mounted within the enclosure and positioned in light communication with the laser so as to direct a small portion of generated light to the power monitoring diode and a major portion of the light through the window of the enclosure.

11. High speed optoelectronic subassembly in an optoelectronic package as claimed in claim 10 wherein the enclosure hermetically seals the optoelectronic component from ambient conditions.

12. High speed optoelectronic subassembly in an optoelectronic package as claimed in claim 10 further including a temperature sensor mounted within the enclosure adjacent the laser and connected to electrical traces for external electrical communication.

13. High speed optoelectronic subassembly in an optoelectronic package as claimed in claim 8 wherein the enclosure, the dielectric support, and the dielectric member are formed of thermally compatible dielectric material.

14. High speed optoelectronic subassembly in an optoelectronic package as claimed in claim 13 wherein the enclosure is formed of at least one ceramic component.

15. High speed optoelectronic subassembly in an optoelectronic package comprising:
   a dielectric support having a first electrical trace on a surface thereof;
   a dielectric member having a first surface mounted on the surface of the dielectric support, a second opposed surface of the dielectric member having a second electrical trace thereon, the dielectric support extending laterally a distance greater than the dielectric member to form a shelf on the surface of the dielectric support;
   a dielectric step positioned on the shelf abutting an end of the dielectric member;
   a semiconductor laser having first and second electrical terminals positioned on the shelf adjacent the dielectric step so as to be light accessible external to the subassembly, the first terminal of the optoelectronic component being electrically connected to the first electrical trace, surfaces of the optoelectronic component and the dielectric step having a substantially similar height and cooperating to provide a mounting platform;
   a resistive element having first and second electrical terminals and positioned on the mounting platform with the first electrical terminal of the resistive element electrically connected to the second terminal of the optoelectronic component and the second terminal of the resistive element electrically connected to the second electrical trace on the dielectric member;
   the dielectric support mounted on a substrate with the first and second electrical traces externally accessible;
   a power monitoring diode supported by the substrate and connected to electrical traces externally accessible of the package;
   an enclosure supported by the substrate and enclosing the laser and the power monitoring diode, the enclosure including a window for the passage of light therethrough; and a lens assembly supported by the substrate within the enclosure and positioned in optical communication with the laser, the lens assembly directing a small portion of light generated by the laser to the power monitoring diode and a major portion of the light through the window.

16. High speed optoelectronic package comprising:

a dielectric substrate;

a high speed subassembly positioned on the substrate including;

a ceramic support having a first electrical trace on a surface thereof;

a ceramic region having a first surface mounted on the surface of the ceramic support, a second opposed surface of the ceramic region having a second electrical trace thereon, the ceramic support extending laterally a distance greater than the ceramic region to form a shelf on the surface of the ceramic support;

a dielectric step positioned on the shelf abutting an end of the ceramic region;

a semiconductor laser having first and second electrical terminals positioned on the shelf adjacent the dielectric step so as to be light accessible external to the subassembly, the first terminal of the optoelectronic component being electrically connected to the first electrical trace, surfaces of the optoelectronic component and the dielectric step having a substantially similar height and cooperating to provide a mounting platform; and a resistive element having first and second electrical terminals and positioned on the mounting platform with the first electrical terminal of the resistive element electrically connected to the second terminal of the optoelectronic component and the second terminal of the resistive element electrically connected to the second electrical trace on the ceramic region;

the ceramic support mounted on the substrate with the first and second electrical traces externally accessible;

a power monitoring diode supported by the substrate and connected to electrical traces externally accessible of the package;

an enclosure supported by the substrate and enclosing the laser and the power monitoring diode, the enclosure including a window for the passage of light therethrough; and a lens assembly supported by the substrate within the enclosure and positioned in optical communication with the laser, the lens assembly directing a small portion of light generated by the laser to the power monitoring diode and a major portion of the light through the window.

* * * * *